(12) United States Patent
Smith et al.

(10) Patent No.: US 7,142,993 B2
(45) Date of Patent: Nov. 28, 2006

(54) DETERMINING A DIFFERENCE BETWEEN A LEVEL OF POWER TO BE SUPPLIED AND AN ESTIMATE

(75) Inventors: David E. Smith, Vancouver, WA (US); Kenneth B. Wade, Battle Ground, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/965,459

(22) Filed: Oct. 13, 2004

(65) Prior Publication Data

US 2006/0080052 A1    Apr. 13, 2006

(51) Int. Cl.
*G06F 19/00* (2006.01)
(52) U.S. Cl. .............. 702/61; 324/76.77
(58) Field of Classification Search ........... 702/61, 702/64, 182–185, 188; 324/76.11, 76.77
See application file for complete search history.

(56) References Cited

U.S. PATENT DOCUMENTS

| | | | |
|---|---|---|---|
| 3,727,103 A * | 4/1973 | Finch et al. ............ | 361/30 |
| 4,495,568 A | 1/1985 | Gilbert et al. | |
| 4,539,487 A | 9/1985 | Ishii | |
| 5,229,651 A | 7/1993 | Baxter, Jr. et al. | |
| 5,248,967 A | 9/1993 | Daneshfar | |
| 5,412,303 A | 5/1995 | Wernicki | |
| 5,545,876 A | 8/1996 | Park | |
| 6,396,674 B1 | 5/2002 | Chen et al. | |
| 6,415,244 B1 | 7/2002 | Dickens et al. | |
| 6,418,002 B1 | 7/2002 | Yang et al. | |
| 6,528,957 B1 | 3/2003 | Luchaco | |
| 6,601,001 B1 | 7/2003 | Moore | |
| 2004/0039960 A1 | 2/2004 | Kassayan | |
| 2004/0084971 A1 | 5/2004 | Shukla et al. | |
| 2004/0095115 A1* | 5/2004 | Kernahan et al. ........ | 323/282 |
| 2004/0139038 A1* | 7/2004 | Ehlers et al. .......... | 705/412 |
| 2004/0184208 A1 | 9/2004 | Liu | |

FOREIGN PATENT DOCUMENTS

WO    WO0210861    2/2002

OTHER PUBLICATIONS

Hewlett-Packard Company, U.S. Appl. No. 10/869,673, filed Jun. 15, 2004, entitled: Power Controller.

* cited by examiner

*Primary Examiner*—Edward Raymond
(74) *Attorney, Agent, or Firm*—Gregg W. Wisdom

(57) ABSTRACT

In one embodiment, an apparatus comprises a device to provide an estimate of supplied power circuitry configured to direct a level of power to be supplied to a load and configured to determine a difference between the level of the power and the estimate.

28 Claims, 4 Drawing Sheets

DETERMINING A DIFFERENCE BETWEEN A LEVEL OF POWER TO BE SUPPLIED AND AN ESTIMATE

BACKGROUND

Some devices supplied with power experience failures. If these failures are not detected, undesirable levels of the power may be supplied.

DESCRIPTION OF THE DRAWINGS

Shown in FIG. 1 is a simplified representation of an embodiment of an inkjet printing system.

Shown in FIG. 2 is a simplified representation of an embodiment of an inkjet printing system.

Figure 3:
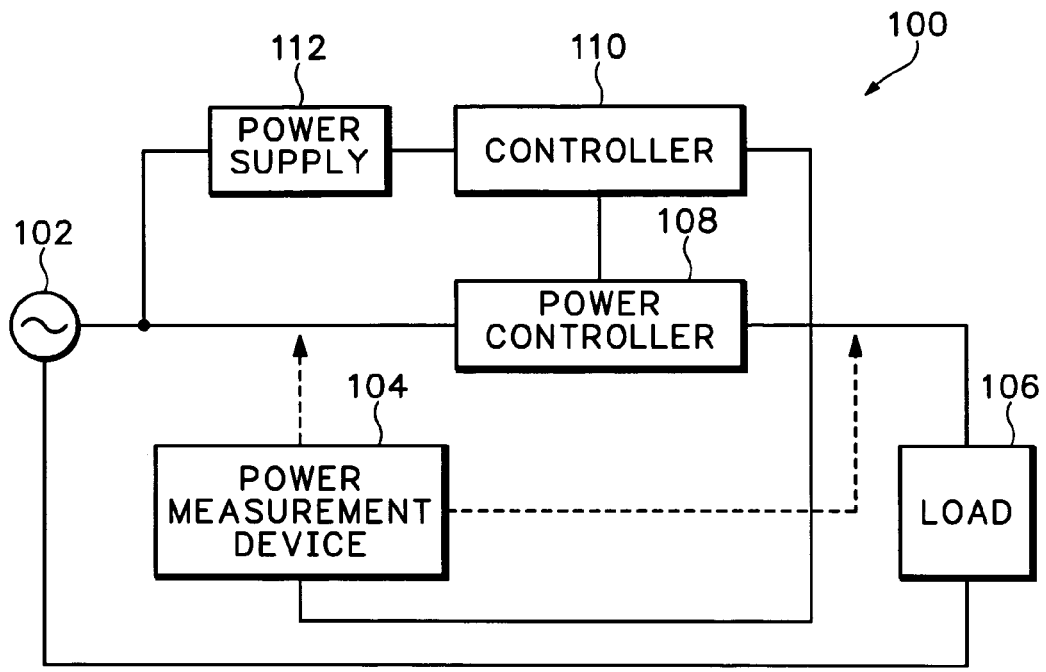

Shown in FIG. 3 is a simplified block diagram representation of an embodiment of a system.

Figure 4:
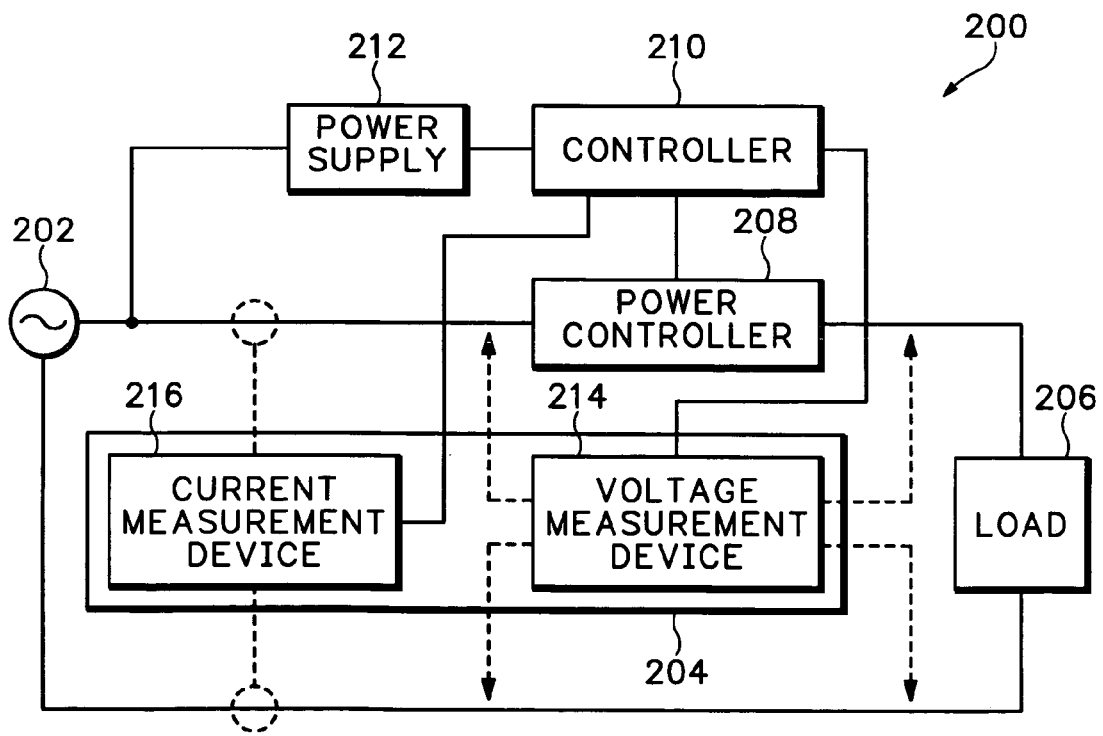

Shown in FIG. 4 is a simplified block diagram representation of an embodiment of a system.

Figure 5:
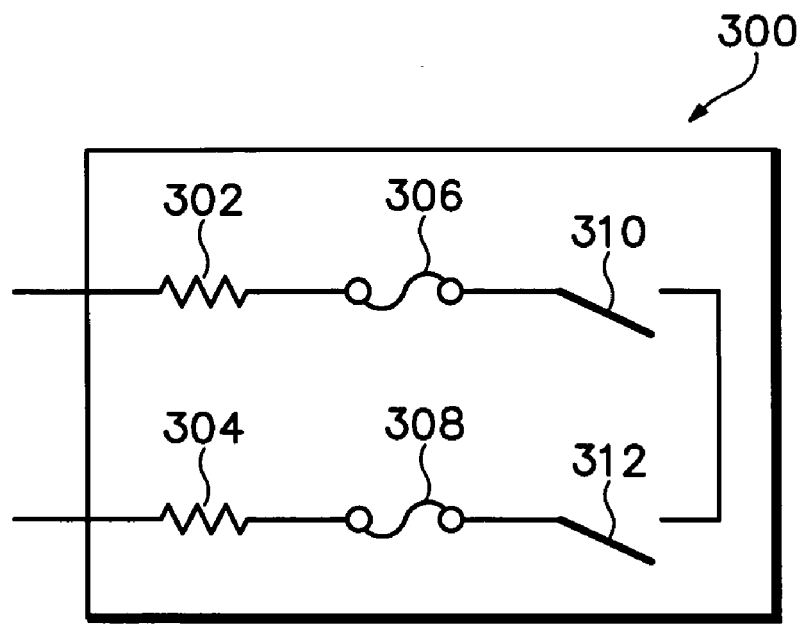

Shown in FIG. 5 is a schematic representation of an embodiment of a heater.

Figure 6:
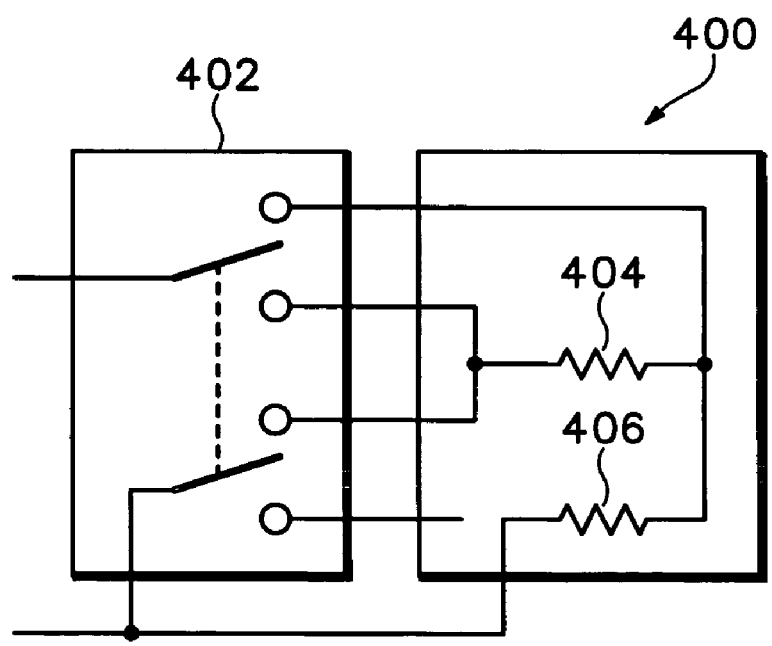

Shown in FIG. 6 is a schematic representation of an embodiment of a heater.

DETAILED DESCRIPTION

Figure 1:
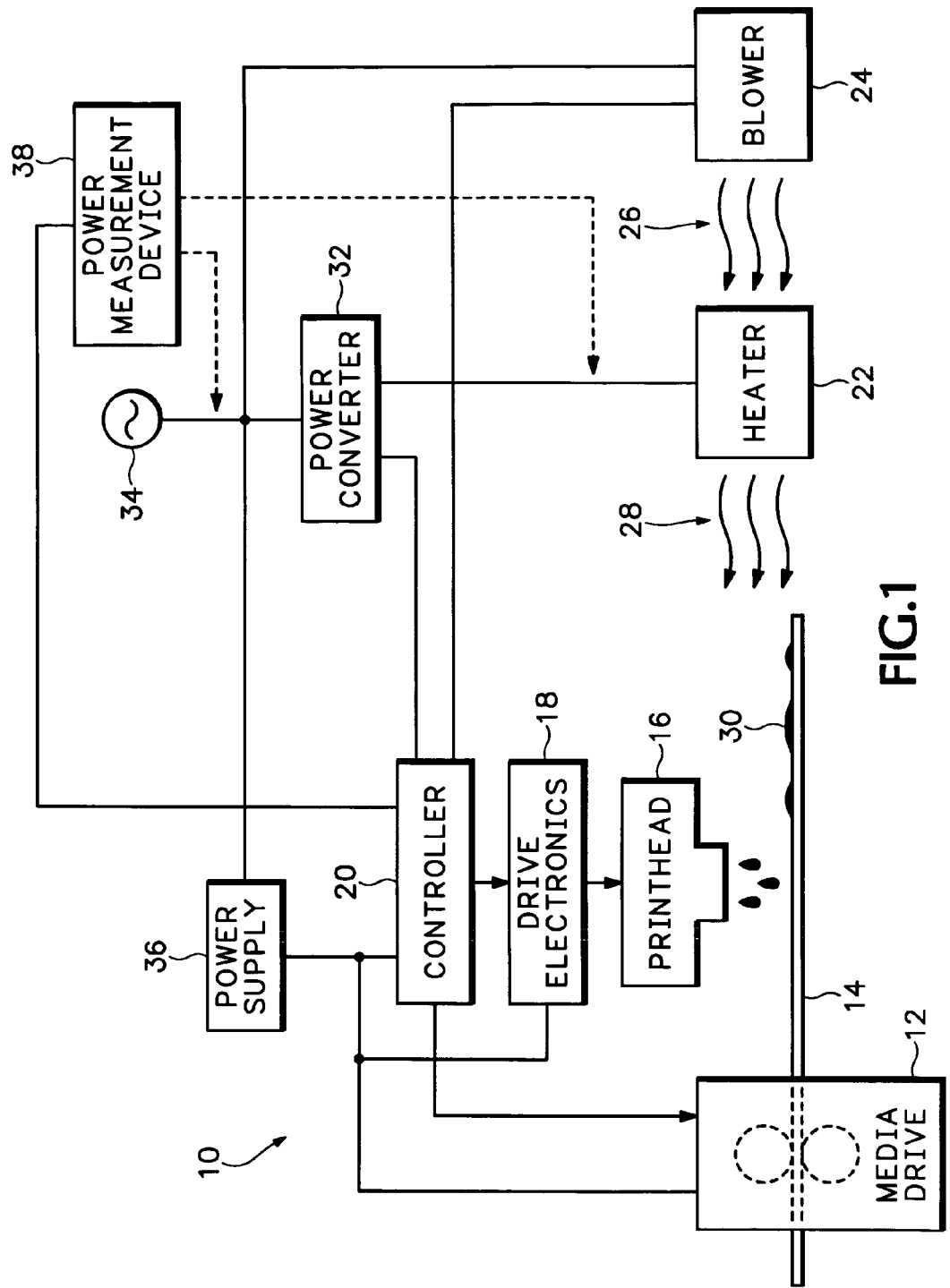

Shown in FIG. 1 is a simplified representation of an embodiment of an image forming system, such as an embodiment of an inkjet printing system, ink jet printing system 10, shown in a simplified form for ease of illustration. Ink jet printing system 10 includes an embodiment of a media movement mechanism, media drive 12, to move media, such as a unit of media 14, from a media storage bin (not shown in FIG. 1) past an embodiment of a colorant ejection device, such as printhead 16 during an image forming operation. Printhead 16 represents, as may be used in various embodiments of ink jet printing system 10, an array of one or more printheads. For ease of illustration, media drive 12 is shown as present at one location in the media path. However, in other embodiments, structure associated with media drive 12 may be located at various places within ink jet printing system 10 to perform the function of moving media within ink jet printing system 10. As unit of media 14 moves past printhead 16, colorant, such as ink, is ejected onto unit of media 14 to form an image corresponding to image data received by inkjet printing system 10. Signals provided to printhead 16 cause ejection of the ink from printhead 16 to form the image. Drive electronics 18 generate the signals to cause printhead 16 to eject the ink to form the image. Various devices within inkjet printing system 10 may be supplied by power supply 36. An embodiment of a processing device, such as controller 20, provides data, formed using the image data, to drive electronics 18 to generate the signals provided to printhead 16. In various embodiments, controller 20 may include a microprocessor executing firmware or software instructions to accomplish its tasks. Or, controller 20 may be included in an application specific integrated circuit (ASIC), formed of hardware and controlled by firmware specifically designed for the tasks it is to accomplish. Furthermore, in alternative embodiments, the functionality associated with controller 20 may be distributed across one or more other devices included within inkjet printing system 10.

The software or firmware may be stored on an embodiment of a computer-readable media included within or separate from controller 20. A computer readable medium can be any media that can contain, store, or maintain programs and data for use by or in connection with the execution of instructions by a processing device. Computer readable media can comprise any one of many physical media such as, for example, electronic, magnetic, optical, electromagnetic, infrared, semiconductor media, or any other suitable media. More specific examples of suitable computer-readable media include, but are not limited to, a portable magnetic computer diskette such as floppy diskettes or hard drives, a random access memory (RAM), a read-only memory (ROM), an erasable programmable read-only memory, or a portable compact disc. Computer readable media may also refer to signals that are used to propagate the computer executable instructions over a network or a network system such as the Internet.

Controller 20 may include a configuration to provide signals to media drive 12 to influence the movement of media through ink jet printing system 10 for accomplishing the image formation operation. Furthermore, an embodiment of circuitry included within controller 20 includes a configuration to provide one or more signals that influence the operation of an embodiment of a heater, such as heater 22. Heater 22 may include an embodiment of a heating element that contributes to the heating of air near heater 22. An embodiment of an air movement device or mechanism, such as blower 24, may push air 26 toward heater 22 so that heat may be transferred from heater 22 to air 26. As air 26 moves past heater 22 on its way toward unit of media 14, heat is transferred to air 26. The heated air 28 continues to move from heater 22 toward unit of media 14. Heated air 28 passing over unit of media 14 provides energy to vaporize at least part of the fluid included in ink 30 deposited onto unit of media 14. In one embodiment, air including the vaporized portions of the fluid is discharged from ink jet printing system 10.

Power is supplied to heater 22 by an embodiment of a power controller, such as power converter 32. Power converter 32 could be implemented using a wide variety of techniques. For example, in one embodiment in which an embodiment of a power source, such as power source 34, supplies an AC voltage, power converter 32 could be implemented using a triac to switch the AC voltage supplied by power source 34. In one embodiment this triac may be switched using a digital signal coupled to the triac through an optical isolator. Using the triac to control the fraction of periods of the AC waveform supplied by power source 34 that are applied to heater 22 allows the average level of power supplied to heater 22 (when it is operating normally) to be controlled. In another embodiment, power converter 32 may include a switching device, such as one or more MOSFETs to control the average power supplied to heater 22 during normal operation. Other embodiments of power converter 32 may be configured to control the power supplied to heater 22 during normal operation when power source 34 provides a DC voltage. Furthermore, embodiments of power converter 32 may be implemented using various embodiments of a controllable analog voltage regulator.

In one embodiment, power converter 32 is configured to attempt to supply a level of power to heater 22 as directed by the operation of the embodiment of the circuitry included within controller 20. The one or more signals provided by the embodiment of the circuitry included within controller 20 to power converter 32 may be a digital value that is used by power converter 32 to attempt to supply the level of power to heater 22 appropriate for a particular operation performed by ink jet printing system 10, such as vaporizing at least part of the fluid included in ink 30. In one embodiment, the digital value could be stored in a register included in an embodiment of power converter 32. The digital value may influence the rate at which a switching device included within power converter 32 operates. The level of the power that the embodiment of the circuitry within controller 20 directs power converter 32 to provide to heater 22 is related to the image forming operations performed by inkjet printing system 10. For example, with deposition of ink 30 onto unit of media 14, the embodiment of the circuitry within controller 20 may direct power converter 32 to provide a level of power to heater 22 suitable for vaporization of at least part of the fluid included within ink 30. When heater 22 is operating properly, the power actually supplied to heater 22 (and therefore consumed by heater 22) will substantially equal the level of the power that the embodiment of the circuitry within controller 20 directs power converter 32 to provide to heater 22. However, it is possible that, at times, one or more types of faults may interfere with the proper operation of heater 22 and make the actual power consumed by heater 22 significantly different than the level of power that the embodiment of the circuitry within controller 20 directs power converter 32 to provide to heater 22. The occurrence of one or more types of faults in heater 22 (or other assemblies included within inkjet printing system 10) may interfere with the proper operation of inkjet printing system 10.

An embodiment of a power measurement device, such as power measurement device 38, may be used to measure one or more parameters associated with the operation of inkjet printing system 10 to provide an estimate of the power supplied to inkjet printing system 10 and/or heater 22. As indicated in FIG. 1, power measurement device 38 may be coupled to controller 20. The embodiment of circuitry included within controller 20 may use the estimate of the power provided by power measurement device 38 to determine a difference between the level of the power that the embodiment of the circuitry included in controller 20 directs power converter 32 to provide to heater 22 and an estimate of the power actually supplied either to inkjet printing system 10 or to heater 22 individually. In one embodiment, the embodiment of the circuitry included within controller 20 may be configured to access a look-up table to obtain a value indicating the level of the power that power converter 32 has been directed to provide to heater 22 using the signal supplied to power converter 32. This value may be used in determining the difference between the level of the power and the estimate of the power actually supplied. In another embodiment the value indicating the level of the power may be computed from the signal supplied to power converter 32.

As indicated in FIG. 1 by the dashed lines extending from the block corresponding to power measurement device 38, power measurement device 38 may be configured to estimate the power supplied by power source 34 to inkjet printing system 10 or configured to estimate the power provided to heater 22 depending upon the location at which the one or more parameters measured to estimate the power are monitored. Power converter 32 may be configured to supply either a DC voltage or an AC voltage to heater 22. In some embodiments of power measurement device 38, the parameter measured to determine the estimate of the power supplied by power source 34 may be the current supplied by power source 34 or the current supplied to heater 22. By using a value for the voltage that should be provided by, for example, power source 34 or provided to heater 22, and by measuring the current provided by power 34 an estimate of the power supplied by power source 34 can be determined.

It should be recognized that this way for providing an estimate of the power supplied may be less accurate in some circumstances than an estimate provided using a measured value of current and a measured value of voltage, thereby making it more difficult to detect certain types of fault conditions (to be described in more detail later) that may occur within inkjet printing system 10 because of variation between the voltage that should be provided and the voltage that is actually provided.

Power measurement device 38 provides an estimate of power supplied to the embodiment of the circuitry within controller 20. As previously mentioned, the embodiment of circuitry included within controller 20 directs power converter 32 to supply a level of power to heater 22. In one embodiment, using the estimate of power supplied provided by power measurement device 38, the embodiment of circuitry included within controller 20 determines a difference between the level of power that power converter 32 was directed to supply to heater 22 and the estimate of the power supplied provided by power measurement device 38. In some embodiments, this difference can be repeatedly determined during the time the embodiment of circuitry included within controller 20 directs power converter 32 to provide power to heater 22. Operation in this manner permits real time monitoring of the operation of heater 22. If the repetition rate is sufficiently frequent, monitoring is effectively performed continuously during operation of heater 22. In some embodiments, when a magnitude of this difference exceeds a threshold or a predetermined value the embodiment of the circuitry included within controller 20 may generate a signal if this condition occurs.

As previously mentioned, power measurement device 38 may be configured to measure the power supplied by power source 34 or the power supplied to heater 22 to determine an estimate of the power supplied. It should be recognized that both of these types of estimates of the power supplied may provide an indication of the operation of heater 22 and/or associated assemblies such as power converter 32 for example. Various types of faults may occur within heater 22 and/or the assemblies associated with heater 22. At least some of these types of faults may affect the estimate of the supplied power provided by power measurement device 38 however power measurement device 38 may be configured to provide the estimate of the power supplied. The types of faults that may affect the estimate of the supplied power may include one or more of such things as an open or a short in one or more heating elements that may be included within heater 22, an open or short in one or more switching devices or power regulating devices that may be used within power converter 32, the opening of one or more thermostats (possibly intermittently) that may be included within heater 22, the opening of one or more fuses, such as thermal fuses, that may be included within heater 22, or an improper configuration of heating elements that may be used within heater 22 for the range of voltage provided by power source 34.

By suitable selection of a value for the threshold or predetermined value, one or more of the previously mentioned types of faults may be detected. If the value for threshold is not made sufficiently large, then it is possible that variations in the amount of power drawn by inkjet printing system 10 and/or the assemblies included within it, such as heater 22, during normal operation may cause the magnitude of the difference to exceed the threshold, thereby incorrectly indicating that a fault condition has occurred. Furthermore, if the value for the threshold is made too large, then it is possible that fault conditions desirable to detect will not cause the magnitude of the difference to exceed the threshold. It should be recognized that selection of the value for the threshold may be influenced by the way in which the estimate of the power is determined. Where the estimate of the power provided is less certain because of the parameter or parameters measured to determine the estimate (as discussed previously), the threshold or predetermined value may be suitably adjusted to reduce the likelihood that the occurrence of a fault condition is indicated when one has not occurred.

In one embodiment, if the magnitude of the difference exceeds the threshold, the embodiment of the circuitry within controller 20 directs power converter 32 to supply a level of zero or substantially zero power to heater 22. This action may reduce the harm resulting from damaging and/or dangerous fault conditions within inkjet printing system 10.

Figure 2:
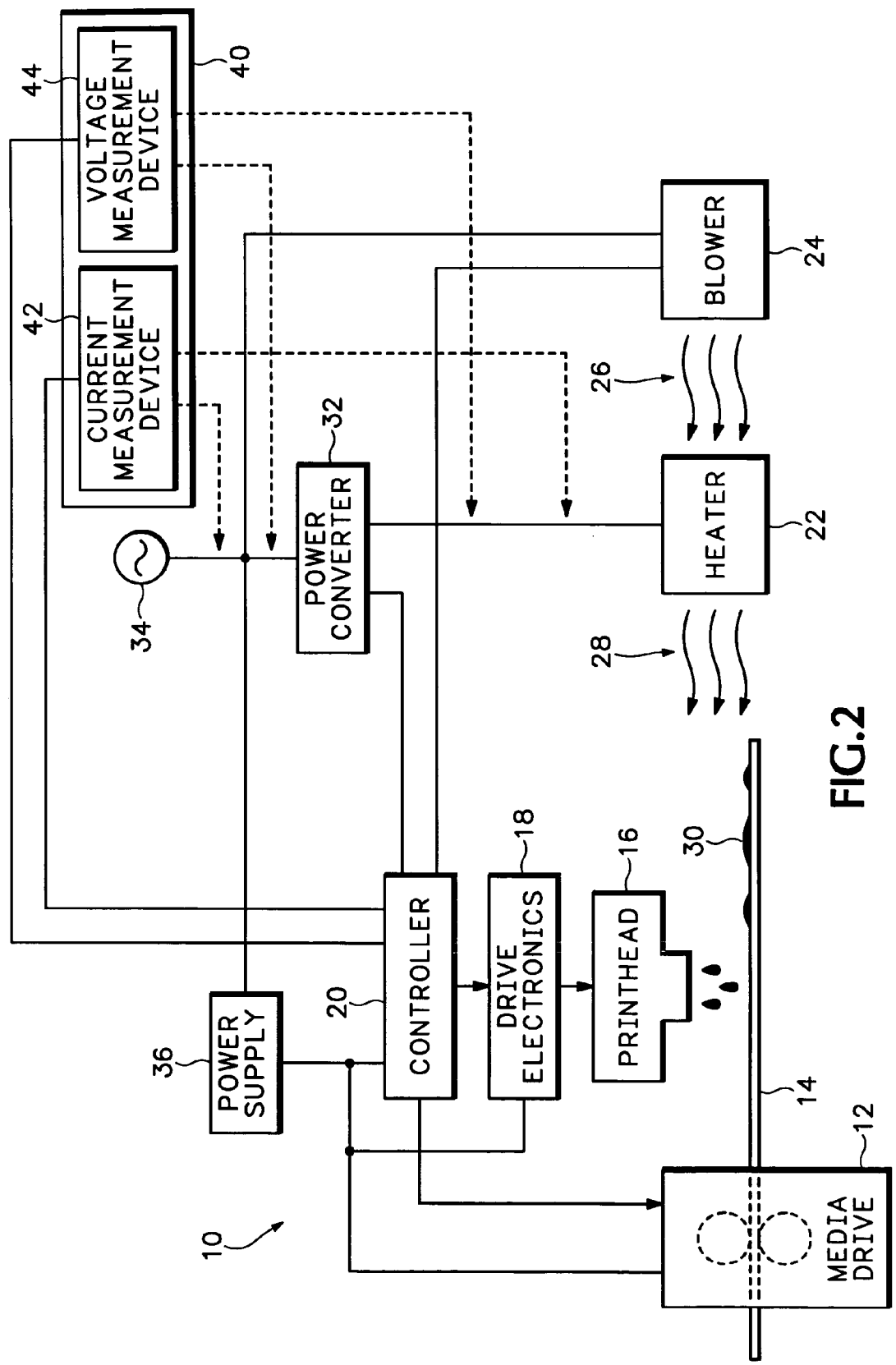

Shown in FIG. 2 is an embodiment of an inkjet printing system, such as inkjet printing system 10, including an embodiment of a power measurement device, such as power measurement device 40. Power measurement device 40 includes an embodiment of a current measurement device, such as current measurement device 42, and an embodiment of a voltage measurement device, such as voltage measurement device 44. Current measurement device 42 and voltage measurement device 44 provide the estimate of the power supplied as signals related to the measurement of, respectively, current and voltage. As indicated by the dashed lines associated with current measurement device 42 and voltage measurement device 44, current and voltage may be measured at different locations within inkjet printing system 10 by power measurement device 40. In one embodiment, power measurement device 40 may be implemented using components such as the ADE7753 or the ADE7755, available through Analog Devices Corporation. In another embodiment, current measurement device 42 could be implemented using a current sense resistor with an amplifier and an A to D converter or with a device to sense a magnetic field resulting from the current to be measured and an amplifier and an A to D converter. In one embodiment, voltage measurement device 44 could be implemented using a voltage divider, an amplifier and an A to D converter.

Shown in FIG. 3 is a simplified block diagram representation of an embodiment of a system, such as system 100. An embodiment of a power source, such as power source 102, may supply power to system 100 during operation. An embodiment of a power measurement device, such as power measurement device 104, may, in one embodiment, be configured to provide an estimate of the power supplied by power source 102 or, in another embodiment, configured to provide an estimate of the power supplied to an embodiment of a load, such as load 106. Providing an estimate of the power in either of these ways may give an indication of the power usage of load 106. Load 106 may be any device or apparatus that receives power provided by an embodiment of a power controller, such as power controller 108. In some embodiments, power controller 108 may include a switching device, such as a triac or a MOSFET, which operates to control the power provided to load 106. In other embodiments, power controller 108 may include a linear regulator to affect the power provided to load 106. Power supply 112 is used to supply power to various assemblies included within system 100.

An embodiment of a processing device, such as controller 110, is configured to direct power controller 108 to provide a level of power to load 106, which may be a target or intended level of power that it is desired to supply to load 106. Power measurement device 104 provides an estimate of the power supplied to controller 110. Using this estimate, controller 110 determines a difference between the estimate of the power supplied and the target level of the power.

In one embodiment, controller 110 determines if a magnitude of the difference between the estimate of the power and the target level of the power exceeds a predetermined value. If the magnitude of the difference does exceed the threshold, then, in one embodiment, controller 110 directs power controller 108 to supply zero or at least substantially zero power to load 106.

The magnitude of the difference exceeding the threshold may indicate that a fault condition has occurred within load 106 or within other assemblies included within system 100. The particular type of fault condition that may be detected is related to the structure of load 106. For example, where load 106 includes heating elements, the fault conditions may include one or more of an open or short of one or more heating elements, improper configuration of the heating elements for the range of voltage provided by power source 102, opening of a thermal fuse, or opening of a thermostat. In one embodiment, if the magnitude of the difference exceeds a threshold, a signal is generated by controller 110 that may be used to indicate to other parts of system 100 that a fault condition has occurred, allowing preventative or corrective action to be taken to address the fault condition. In one embodiment, the signal may take the form of an error code provided by controller 110 indicating a possibility for a cause of the fault condition. The particular error code generated may be related to the magnitude by which the difference exceeds the threshold.

Shown in FIG. 4 is an embodiment of a system, such as system 200. The functions and structure of power source 202, load 206, power controller 208, and power supply 212 are similar to the corresponding elements disclosed in FIG. 3. In system 200, an embodiment of a power measurement device, power measurement device 204, includes an embodiment of a voltage measurement device, such as voltage measurement device 214 and an embodiment of a current measurement device, such as current measurement device 216. Voltage measurement device 214 and current measurement device 216 provide the estimate of the power supplied as signals related to the measurement of, respectively, current and voltage. As indicated by the dashed lines associated with voltage measurement device 214 and current measurement device 216, voltage and current may be measured at different locations within system 200 by power measurement device 204. Voltage measurement device 214 and current measurement device 216 may be implemented in a manner similar to what was described for voltage measurement device 44 and current measurement device 42.

Shown in FIG. 5 is an embodiment of heater 22, such as heater 300. The embodiment of heater 22 includes heating element 302 and heating element 304. Heater 22 further includes thermal fuses 306 and 308 associated with, respectively, heating element 302 and heating element 304. If the temperature of a heating element associated with a thermal fuse becomes sufficiently high, that thermal fuse will permanently enter an electrically open state and interrupt the current flow through the heating element. Thermostat 310 and thermostat 312 can electrically open and interrupt the current flow through the heating element if the temperature, respectively, of the associated heating element 302 or heating element 304 becomes sufficiently high. However, thermostat 310 and thermostat 312 may be reset after opening.

Shown in FIG. 6 is an embodiment of heater 22, such as heater 400. Heater 400 includes an embodiment of a switching mechanism, such as switching mechanism 402. Switching mechanism 402 permits configuration of heating element 404 and heating element 406 in one of a parallel connection or a series connection. In one embodiment, the operation of switching mechanism 402 is functionally represented by the action of a double pole double throw switch. In a first position, the switching mechanism may connect heating element 404 and heating element 406 in a series connection suitable for operation with a power source having a voltage range from 220 VRMS to 240 VRMS. In a second position, the switching mechanism may connect heating element 404 and heating element in a parallel connection suitable for operation with a power source having a voltage range from 110 VRMS to 120 VRMS.

In some circumstances, it may be possible that the configuration of switching mechanism 402 may be incorrect for the voltage range available from the power source. In the case of incorrect configuration of switching mechanism 402, excessive current may flow for proper operation of heater 400 or insufficient current may flow for proper operation of heater 400. If power converter 32 was directed to supply a level of power to heater 400 having an incorrect configuration, it is likely that a magnitude of the difference between the estimate of the power supplied to heater 400 and the level of power converter 32 was directed to supply would exceed the threshold, thereby indicating occurrence of a fault condition. Where the incorrect configuration caused voltage in the 220 VRMS to 240 VRMS range to be applied to a parallel connection of the heating elements, excessive power for proper operation would be supplied to heater 400. Where the incorrect configuration caused voltage in the 110 VRMS to 120 VRMS range to be applied to a series connection of the heating elements, insufficient power for proper operation would be supplied to heater 400.

While the disclosed embodiments have been particularly shown and described, it should be understood that many variations may be made to these without departing from the spirit and scope defined in the following claims. The detailed description should be understood to include all novel and non-obvious combinations of the elements that have been described, and claims may be presented in this or a later application to any novel and non-obvious combination of these elements. Combinations of the above exemplary embodiments, and other embodiments not specifically described herein will be apparent upon reviewing the above detailed description. The foregoing embodiments are illustrative, and any single feature or element may not be included in the possible combinations that may be claimed in this or a later application. Therefore, the scope of the claimed subject matter should be determined with reference to the following claims, along with the full range of equivalents to which such claims are entitled.

What is claimed is:

1. An apparatus, comprising:
a device to provide an estimate of supplied power; and
circuitry configured to direct a level of power to be supplied to a plurality of heating elements and configured to determine a difference between the level of the power to be supplied and the estimate to detect the plurality of the heating elements incorrectly configured for a voltage range provided by a power source.

2. The apparatus as recited in claim 1, wherein:
the circuitry includes a configuration to direct the level of the power to be supplied to the plurality of the heating elements to be substantially zero if a magnitude of the difference exceeds a threshold indicating incorrect configuration of the plurality of the heating elements.

3. The apparatus as recited in claim 1, further comprising:
a power controller configured to attempt to provide the level of the power to be supplied to the plurality of the heating elements as directed by the circuitry.

4. The apparatus as recited in claim 3, wherein:
the power controller includes a switching device; and
the circuitry includes a controller a configured to detect a failure of the switching device by determining if a magnitude of the difference exceeds a threshold.

5. The apparatus as recited in claim 1, wherein:
the device includes a current measurement device; and
the current measurement device includes a configuration to determine the estimate of the supplied power by measurement of a value of a current supplied by the power source coupled to a system including the plurality of the heating elements.

6. The apparatus as recited in claim 1, wherein:
the device includes a current measurement device; and
the current measurement device includes a configuration to determine the estimate of the supplied power by measurement of a value of a current supplied to the plurality of the heating elements.

7. The apparatus as recited in claim 1, wherein:
the device includes a power measurement device configured to determine the estimate of the supplied power by measurement of a voltage value and a current value.

8. The apparatus as recited in claim 1, further comprising:
a mechanism to selectively configure the plurality of the heating elements for operation with the power source to provide the voltage range and with the power source coupled to a system including the plurality of the heating elements.

9. The apparatus as recited in claim 8, wherein:
the circuitry includes a configuration to detect the plurality of the heating elements incorrectly configured for the voltage range of the power source by determining if a magnitude of the difference exceeds a threshold.

10. The apparatus as recited in claim 1, further comprising:
a thermal fuse coupled to the plurality of the heating elements; and
the circuitry includes a configuration to detect an open of the thermal fuse by determining if a magnitude of the difference exceeds a threshold.

11. The apparatus as recited in claim 1 further comprising:
a thermostat coupled to the plurality of the heating elements; and
the circuitry includes a configuration to detect opening of the thermostat by determining if a magnitude of the difference exceeds a threshold.

12. A method, comprising:
selectively configuring a plurality of heating elements for operation with power sources capable of providing a plurality of ranges of voltage;
directing a level of power to be supplied to the plurality of heating elements;
determining an estimate of the power provided to the plurality of heating elements;
determining a difference between the level of the power to be supplied to the plurality of heating elements and the estimate; and
determining if a magnitude of the difference exceeds a predetermined value.

13. The method as recited in claim 12, wherein:
the determining the estimate includes measuring a value of a voltage supplied to a system including the the plurality of the heating elements and a value of a current supplied to the system.

14. The method as recited in claim 13, wherein:
the determining the estimate of the power includes computing the estimate using the value of the voltage and the value of the current.

15. The method as recited in claim 12, wherein:
the determining the estimate includes measuring a value of a voltage supplied to the plurality of the heating elements and a value of a current supplied to the plurality of the heating elements.

16. The method as recited in claim 12, wherein:
a heater in an image forming system includes the plurality of the heating elements.

17. The method as recited in claim 16, wherein:
the heater includes a thermal fuse.

18. The method as recited in claim 17, further comprising:
detecting a fault if the thermal fuse opens and the magnitude of the difference exceeds the predetermined value.

19. The method as recited in claim 16, wherein:
the healer includes a thermostat.

20. The method as recited in claim 19, further comprising:
detecting a fault if the thermostat opens and the magnitude of the difference exceeds the predetermined value.

21. The method as recited in claim 12, wherein:
the selectively configuring the plurality of the heating elements includes using a mechanism for the selectively configuring the plurality of the heating elements.

22. The method as recited in claim 21, wherein:
the selectively configuring the plurality of heating elements includes incorrectly configuring the plurality of the heating elements; and
further comprising detecting a fault if the magnitude of the difference exceeds the predetermined value.

23. The method as recited in claim 12, further comprising:
detecting a fault if one or more of the plurality of the heating elements opens and the magnitude of the difference exceeds the predetermined value.

24. The method as recited in claim 12, further comprising:
with a power controller providing the power to the load, detecting a fault if an open or a short occurs in the power controller and the magnitude of the difference exceeds the predetermined value.

25. A method for detecting a fault in an image forming system, comprising:
selectively configuring a plurality of heating elements for operation with power sources for providing a plurality of ranges of voltages;
directing a power controller to provide a level of power to the plurality of the heating elements;
determining an estimate of the power provided to the heater;
determining a difference between the level of the power to be provided to the heater and the estimate; and
detecting a fault if a magnitude of the difference exceeds a predetermined value.

26. The method as recited in claim 25, wherein:
the selectively configuring the plurality of the heating elements includes using a mechanism for selectively configuring the plurality of the heating elements.

27. The method as recited in claim 25, wherein:
the selectively configuring the plurality of the heating elements includes configuring the plurality of the heating elements using the mechanism incorrectly; and
detecting the fault if the magnitude of the difference exceeds the predetermined value.

28. An apparatus, comprising:
means for connecting a plurality of heating elements for operation with oower sources for providing a plurality of ranges of voltages;
means for supplying power to the plurality of heating elements;
means for determining an estimate of an amount of the power supplied to the load; and
means for directing the means for supplying power to supply a level of the power to the load and for determining if a magnitude of a difference between the level of the power to be supplied to the load and the estimate of the amount of the power exceeds a threshold.

* * * * *